AUTOMATIC GAIN CONTROL CIRCUIT EMPLOYING A FIELD-EFFECT TRANSISTOR

Filed Feb. 11, 1969

INVENTOR
DAVID L. ROYER
BY Louis A Kline
John J. Callahan
Glenn W. Bowen Sr.
HIS ATTORNEYS

United States Patent Office 3,523,254
Patented Aug. 4, 1970

3,523,254

AUTOMATIC GAIN CONTROL CIRCUIT EMPLOYING A FIELD-EFFECT TRANSISTOR

David L. Royer, Dayton, Ohio, assignor to The National Cash Register Company, Dayton, Ohio, a corporation of Maryland Filed Feb. 11, 1969, Ser. No. 798,311
Int. Cl. H03g *3/30*
U.S. Cl. 330—29 2 Claims

ABSTRACT OF THE DISCLOSURE

An input signal is delayed before it is supplied to the base of a bipolar transistor amplifier, and it is also supplied to a capacitor that has a potentiometer connected in parallel with it to develop a control potential that is coupled to the gate of a field-effect transistor. The field-effect transistor has its drain-source path coupled through another capacitor to an intermediate point on the load current path to ground of the bipolar transistor which is connected to the emitter of the bipolar transistor in series with the collector-emitter path of the bipolar transistor.

BRIEF DESCRIPTION OF THE PREFERRED EMBODIMENT

Figures 1, 2:
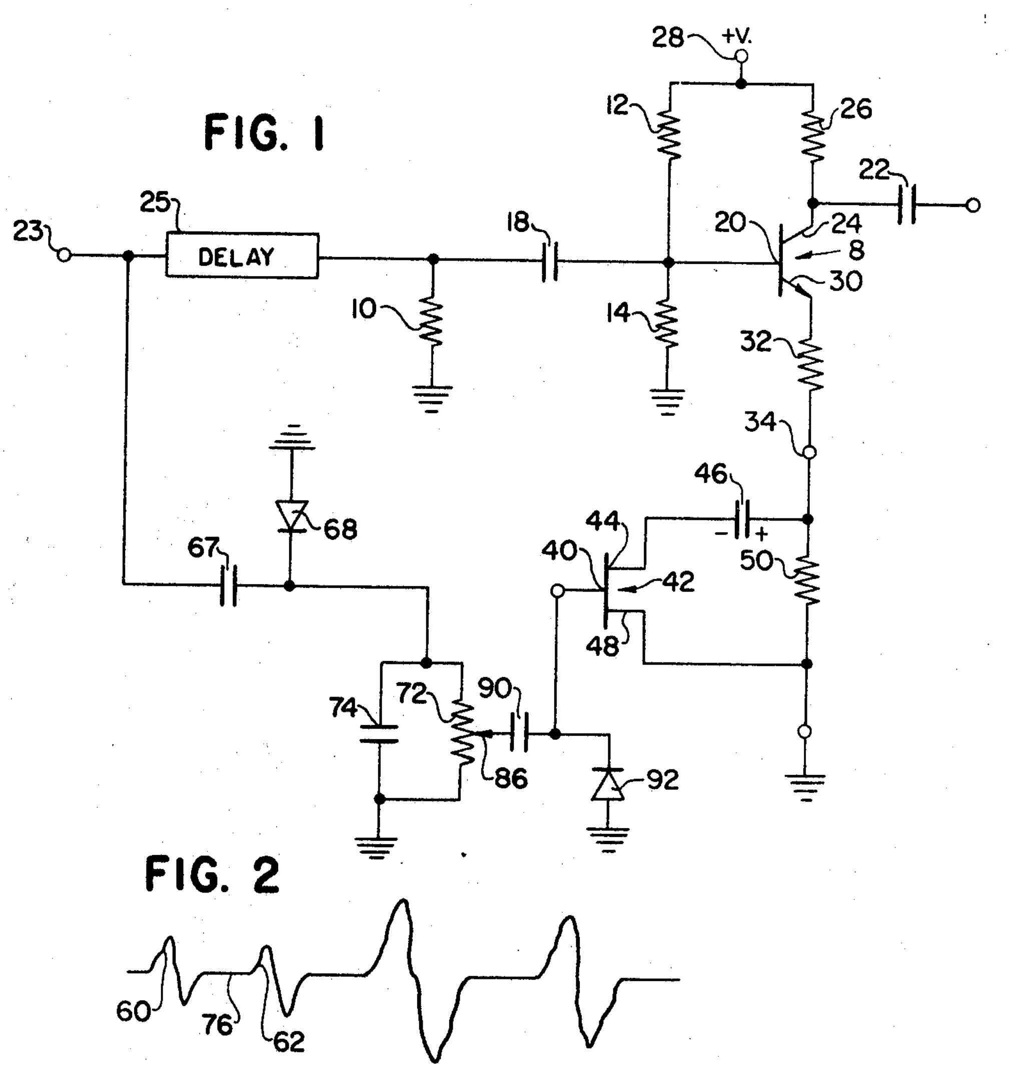
FIG. 1 is a schematic of a bipolar transistor amplifier circuit and an associated field-effect transistor gain control circuit.
FIG. 2 is a diagram of an input signal that is supplied to the input terminal of the circuit of FIG. 1.

An input signal such as that shown in FIG. 2, that may be supplied to the input terminal 23 of FIG. 1 by an input source (not shown)—for example, a magnetic sensing head—may represent a number of data bits which are recorded in a form such that they can be utilized by an output device (not shown)—for example, a character reader. The input signal that is supplied to the input terminal 23 is passed through the delay line 25 and the capacitor 18 to the base 20 of the bipolar transistor 8, which in the detailed embodiment is an NPN transistor. The output signal is coupled to the output device (not shown) through the capacitor 22, which is connected to the collector 24 of the transistor 8. A load resistor 26 is connected between the collector 24 of the transistor 8 and a positive voltage supply that is connected to the terminal 28. The emitter 30 of the transistor 8 is connected to the resistor 32, and the resistors 10, 12, and 14 are biasing resistors for the transistor 8.

The input signal that is supplied to the terminal 23 is also coupled through the capacitor 67 to the diode 68, which has its anode connected to ground and its cathode connected to the capacitor 67, in order to rectify the input signal. If the input signal is not bipolar, the diode 68 may be removed. The potentiometer 72 is connected in parallel with the capacitor 74 between the cathode of the diode 68 and ground. The capacitor 74 acquires an increased charge during positive excursions of the input signal, and the potentiometer 72 provides a discharge path for the capacitor 74 at other times. For example, the capacitor 74 discharges through the potentiometer 72 during the interval 76 between positive portions 60 and 62 of the input signal. The capacitor 74 and the potentiometer 72 thereby develop a control potential that is representative of the input signal.

The potentiometer 72 has a variable output terminal 86, which is connected to one plate of the coupling capacitor 90, which has its other plate connected to the cathode of the diode 92 and to the gate 40 of the field-effect transistor 42. The anode of the diode 92 is connected to ground, and the diode 92 thereby conducts negative polarity pulses to ground. The drain 44 of the field-effect transistor 42 is connected to one plate of the capacitor 46, and the other plate of the capacitor 46 is connected to the intermediate point 34 on the load current path of the transistor 8 to a ground reference potential comprising the resistors 32 and 50. The source 48 of the field-effect transistor 42 is connected to ground, and the resistor 50 is connected between the intermediate point 34 and ground. A conventional transistor amplifier may be inserted between the input terminal 23 and the capacitor 67 if desired.

Changes of the potential on the gate 40 of the field-effect transistor 42, due to changes in the magnitude of the input signal, will cause the capacitor 46 to charge and discharge through the drain-source path of the field-effect transistor 42, thereby controlling the gain of the transistor 8, so that a steady quiescent output level is maintained and so that even a single input pulse is amplified without substantial distortion.

Representative resistor and capacitor values for the circuit of FIG. 1 are shown below for illustrative purposes.

RESISTORS AND POTENTIOMETER

| Resistors: | Ohms |
|---|---|
| 26 | 2,000 |
| 32 | 470 |
| 50 | 1,500 |
| Potentiometer 72 | 0–200,000 |

CAPACITORS

| Capacitors: | Microfarads |
|---|---|
| 46 | 4 |
| 67 | 4 |
| 74 | 0.092 |
| 90 | 80 |

What is claimed is:

1. A circuit for controlling the gain of an amplifying circuit which includes a bipolar transistor and which has a load current path to a reference potential that is connected to the emitter of the bipolar transistor in series with the collector-emitter path of the bipolar transistor, comprising:

(a) means to delay an input signal before it is supplied to the base of the bipolar transistor;

(b) a first capacitor coupled to receive the input signal to store a charge that is representative of the input signal;

(c) a potentiometer connected in parallel with the first capacitor for discharging the first capacitor at any time the input signal is ineffective to maintain or increase the charge of the first capacitor, with the first capacitor and the potentiometer being coupled to the reference potential;

(d) a field-effect transistor;

(e) a second capacitor connected between the gate of the field-effect transistor and a variable terminal of the potentiometer for coupling a control potential from the potentiometer to the gate which is a function of the input signal; and (f) a third capacitor coupled to an intermediate point on the load current path to the reference potential and in series with the drain-source path of the field-effect transistor, the drain-source path of the field-effect transistor being coupled to the reference potential.

2. A circuit as in claim 1 wherein the input signal is bipolar and means are employed to rectify the input signal before it is supplied to the first capacitor.

References Cited

UNITED STATES PATENTS 2,364,755 12/1944 Ritzmann ........ 330—141 X

FOREIGN PATENTS 870,922 6/1961 Great Britain.

OTHER REFERENCES

Todd, "FETs As Voltages—Variable Resistors," Electronic Design, vol. 13, No. 19, Sept. 13, 1965, 330–38FE.

ROY LAKE, Primary Examiner

J. B. MULLINS, Assistant Examiner

U.S. Cl. X.R.

330—38